United States Patent
Hwang

(10) Patent No.: US 6,711,711 B2
(45) Date of Patent: Mar. 23, 2004

(54) ERROR CORRECTIBLE CHANNEL CODING METHOD

(76) Inventor: Euiseok Hwang, Video Research Center, Daewoo Electronics Co., Ltd., 541, 5-Ga, Namdaemoon-Ro, Jung-Gu, Seoul (KR), 100-095

(*) Notice: Subject to any disclaimer, the term of this patent is extended or adjusted under 35 U.S.C. 154(b) by 444 days.

(21) Appl. No.: 09/829,480

(22) Filed: Apr. 9, 2001

(65) Prior Publication Data

US 2003/0023931 A1 Jan. 30, 2003

(51) Int. Cl.[7] .................. H03M 13/03; H03M 5/00; H04L 23/02
(52) U.S. Cl. .................. 714/792; 375/265; 341/58
(58) Field of Search ............... 714/795, 792, 714/796; 375/262, 341, 265; 341/58–59

(56) References Cited

U.S. PATENT DOCUMENTS

| | | | | |
|---|---|---|---|---|
| 5,263,033 A | * | 11/1993 | Seshadri .................. | 714/792 |
| 5,388,124 A | * | 2/1995 | Laroia et al. .............. | 375/286 |
| 6,504,877 B1 | * | 1/2003 | Lee ........................... | 375/265 |
| 6,535,647 B1 | * | 3/2003 | Abousleman .............. | 382/253 |

OTHER PUBLICATIONS

Lattice and Trellis Quantization with Lattice- and Trellis-Bounded Codebooks–High–rate Theory for Memoryless Sources Eyuboglu et al.Information Theory, IEEE Transactions on, vol.: 39 Issue: 1, Jan. 1993 pp. 46 –59.*

* cited by examiner

*Primary Examiner*—Albert Decady
*Assistant Examiner*—Cynthia Britt

(57) ABSTRACT

A coding scheme encodes a series of M-bit message words into a series of N-bit codewords having a bounded unbalance. A part of the M-bit message words are used to index bits and others source words. The message words are grouped to a plurality of subsets using the index bits thereof. The unbalanced codewords are classified to a plurality of sets based on a state transition in a trellis. Each of the classified unbalanced codewords is stored at a codebook for each codeword set, respectively. The codebook has the source words, a codeword ID for each of the source words and the classified unbalanced codewords. The message words are encoded into the respective codeword in the codebook, respectively, by using the index bits of the message words and the state transition in the trellis having states and levels. The codewords are selected by transition for each state at each level stage of the trellis based on correlations.

11 Claims, 8 Drawing Sheets

TRELLIS DIAGRAM

| CODE WORD ID | MESSAGE WORD $b_0b_1b_2b_3b_4b_5$ | CODEWORD | | | |
|---|---|---|---|---|---|
| | | | $S_6$ | $S_7$ | $S_8$ |
| ° ° ° | ° ° ° | ° ° ° | ° ° ° | ° ° ° | ° ° ° |
| 11 | 001010 | | 001001110010 | 001001011100 | 001000111100 |
| 12 | 001011 | | 001010011100 | 001001101010 | 001001101010 |
| 13 | 001100 | | 001010101010 | 001001110001 | 001001100110 |
| 14 | 001101 | | 001010110001 | 001010011010 | 001001101001 |
| 15 | 001110 | | 001011000110 | 001010100110 | 001010010110 |
| 16 | 001111 | | 001011001001 | 001010101001 | 001010011001 |
| 17 | 010000 | | 001011001010 | 001011000101 | 001010100101 |
| 18 | 010001 | | 001100010010 | 001100010110 | 001011000011 |
| 19 | 010010 | | 001100101001 | 001100011001 | 001100001110 |
| 20 | 010011 | | 001101000101 | 001100100101 | 001100010101 |
| ° ° ° | ° ° ° | ° ° ° | ° ° ° | ° ° ° | ° ° ° |

FIG. 6

RECEIVED DATA STREAM=[0.16 0.16 0.71 0.77 0.22 0.08 0.19 0.68 0.31 0.81 0.70 0.13]

|  | MIN. ED | CODEWORD | CODE WORD ID |
|---|---|---|---|
| $S_1$ | 1.19 | 000100011110 | 7 |
| $S_2$ | 1.34 | 001110010010 | 19 |
| $S_3$ | 1.28 | 001100110100 | 15 |
| $S_4$ | 1.24 | 001110000110 | 20 |
| $S_5$ | 1.18 | 001100011100 | 16 |
| $S_6$ | 1.27 | 001100100110 | 18 |
| $S_7$ | 0.79 | 001100010110 | 18 |
| $S_8$ | 1.17 | 001100001110 | 19 |

|  | MIN. ED | CODEWORD | CODE WORD ID |
|---|---|---|---|
| $\underline{S_1}$ | 1.34 | 001110110110 | 61 |
| $\underline{S_2}$ | 1.30 | 011100011110 | 43 |
| $\underline{S_3}$ | 1.30 | 101100011110 | 26 |
| $\underline{S_4}$ | 1.32 | 001100011111 | 60 |
| $\underline{S_5}$ | 1.39 | 101100110110 | 28 |
| $\underline{S_6}$ | 1.36 | 011110010110 | 42 |
| $\underline{S_7}$ | 1.36 | 101110010110 | 25 |
| $\underline{S_8}$ | 1.39 | 001110010111 | 57 |

ERROR CORRECTIBLE CHANNEL CODING METHOD

FIELD OF THE INVENTION

The present invention relates to a channel coding; and, more particularly, to a method capable of detecting and correcting errors in data encoded with a pseudo-balanced code having a higher code rate.

BACKGROUND OF THE INVENTION

As is well known, the demand for a storage system capable of storing a large amount of optical data such as a motion picture film has been increased. Therefore, various types of volume holographic data storage (VHDS) systems incorporating therein a storage medium have been recently developed for realizing high density optical storage capabilities. Further, a coding technique capable of detecting and correcting errors by noisy or otherwise impaired channel has been also developed.

Convolutional codes are a class of channel codes used to mitigate the effects of channel noise in the transmission of information. A convolutional encoder in a transmitter is a finite-state machine whose operation may be described in terms of trellis. As it accepts data bits, the convolutional encoder proceeds through a sequence of states and produces an output which subsequently is used to define an output sequence of symbols that is transmitted over a noisy or otherwise impaired channel. The output sequence of symbols corresponds to a path through the trellis that describes such encoding operation.

A maximum-likelihood decoder for convolutional codes is known in the art as the Viterbi decoder. The Viterbi decoder determines the output sequence of symbols that was transmitted based on the received corrupted version of the transmitted sequence and knowledge of the code used by the encoder. This sequence corresponds to the "best path", that is, the single path through the trellis having the best so-called path metric. For the Gaussian channel, for example the output sequence is determined by correlating with the received version all possible transmitted code sequences corresponding to paths through the trellis and then choosing, as the "maximum likelihood" sequence, the sequence where the correlation is maximum.

As it operates, the Viterbi decoder disregards a number of paths in the trellis and considers only the so-called surviving paths as candidates for the best path. Looking backwards in time or "tracing back", the surviving paths tend to merge into the same predecessor path such that the value of an earlier received symbols may be decided. For so-called continuous Viterbi decoding, at any point in time a decision is made as to the value of an earlier received symbol by tracing back along the path identified as the best path at that time.

In the VHDS systems, variations in signal strength cause problems in detection. One possible solution to the problems in detection is the use of balanced codes. A balanced code is one in which each codeword is balanced-bit and contains exactly the same number of 1's as 0's. Since the number of 1's and 0's is balanced, the brighter 50% of samples are considered to be 1's and the dimmer 50% of the samples are considered to be 0's. In addition, the minimum Hamming distance, the minimum number of bits by which two distinct codewords differ, is 2. In the balanced code, a change in just one bit yields an invalid codeword because the result is unbalanced. To remain in balance, at least two bits must be changed.

FIG. 1 represents a trellis 100 of a conventional rate 8:12 balanced finite-state code capable of correcting an error. Trellis 100 has a plurality of state values which describe a sequence of state transitions. That is, trellis 100 has four top level states, state a, state b, state c and state d. Likewise, trellis 100 has four bottom level states, state a, state b, state c and state d, which are the same states as the top level states. Each transition in trellis 100 represents a set of 64 balanced codewords of length 12. There are eight such sets, assigned to the transitions as shown in Table A.

TABLE A

|  | Bottom State | | | |
| --- | --- | --- | --- | --- |
| Top State | a | b | c | d |
| a | $S_1$ | $S_2$ | $S_3$ | $S_4$ |
| b | $S_5$ | $S_6$ | $S_7$ | $S_8$ |
| c | $S_2$ | $S_1$ | $S_4$ | $S_3$ |
| d | $S_6$ | $S_5$ | $S_8$ | $S_7$ |

Each set, $S_i$, (i=1, 2, . . . , 8) is an arbitrary set of 64 balanced binary codewords, each codeword being represented by 12 bits of $b_0 b_1 b_2 \ldots b_{11}$, where $b_1 + 2b_2 + 3b_3 \ldots + 11b_{11} - i$ is a multiple of 12.

This code has a minimum distance of 4, which provides considerable error-detecting and correcting capability in the presence of noise. However, there is a problem in the use of the rate 8:12 balanced finite-state code. That is, the rate 8:12 balanced finite-state code scheme has a lower code rate, i.e., about 67%. Therefore, there is a need for a coding scheme having an error-correcting capability and a higher code rate.

SUMMARY OF THE INVENTION

It is, therefore, an object of the present invention to provide a coding scheme having an error-correcting capacity and a higher code rate.

In accordance with one embodiment of the present invention, there is provided a method for encoding a series of M-bit message words into a series of N-bit codewords having a bounded unbalance, a part of the message words being used to index bits and others source words, wherein the M and N are positive integer and the N is larger than the M, comprising steps of: grouping the message words to a plurality of subsets using the index bits; classifying the unbalanced codewords to a plurality of sets based on a state transition in a trellis having states and levels, each of the classified unbalanced codewords being stored at a codebook for each codeword set, respectively, the codebook having the source words, a codeword ID for each of the source words and the classified unbalanced codewords;

encoding the message words into the respective codeword in the codebook, respectively, by using the index bits of the message words and the state transition in the trellis, the codewords being selected by transition for each state at each level of the trellis based on correlations.

In accordance with another embodiment of the present invention, there is provided a method for decoding a codeword, which is encoded by the above encoding method, from a series of data word representing intensities of an analog signal, comprising steps of: receiving the data word; calculating branch metrics between the data word and each codeword in the codeword set classified by the state transition in the trellis to obtain minimum branch for each bottom states; figuring out path metric for each bottom state based on the calculated branch metrics to select a minimum path metric thereamong for each bottom state in the trellis;

selecting a best path having the smallest path metric having states and decoding stages; tracing back the selected best path and decoding a codeword corresponding to a state transition into a message word by using the codeword ID in the codebook.

BRIEF DESCRIPTION OF THE DRAWINGS

The above and other objects and features of the present invention will become apparent from the following description of preferred embodiments given in conjunction with the accompanying drawings, in which:

FIG. 4 illustrates a part of exemplary codebook 400 for containing the respective codewords in the codeword sets in accordance with the preferred embodiment of the present invention;

FIG. 6 shows a set of candidate codewords for received data words in accordance with the preferred embodiment of the present invention;

DETAILED DESCRIPTION OF THE PREFERRED EMBODIMENTS

Figure 1:
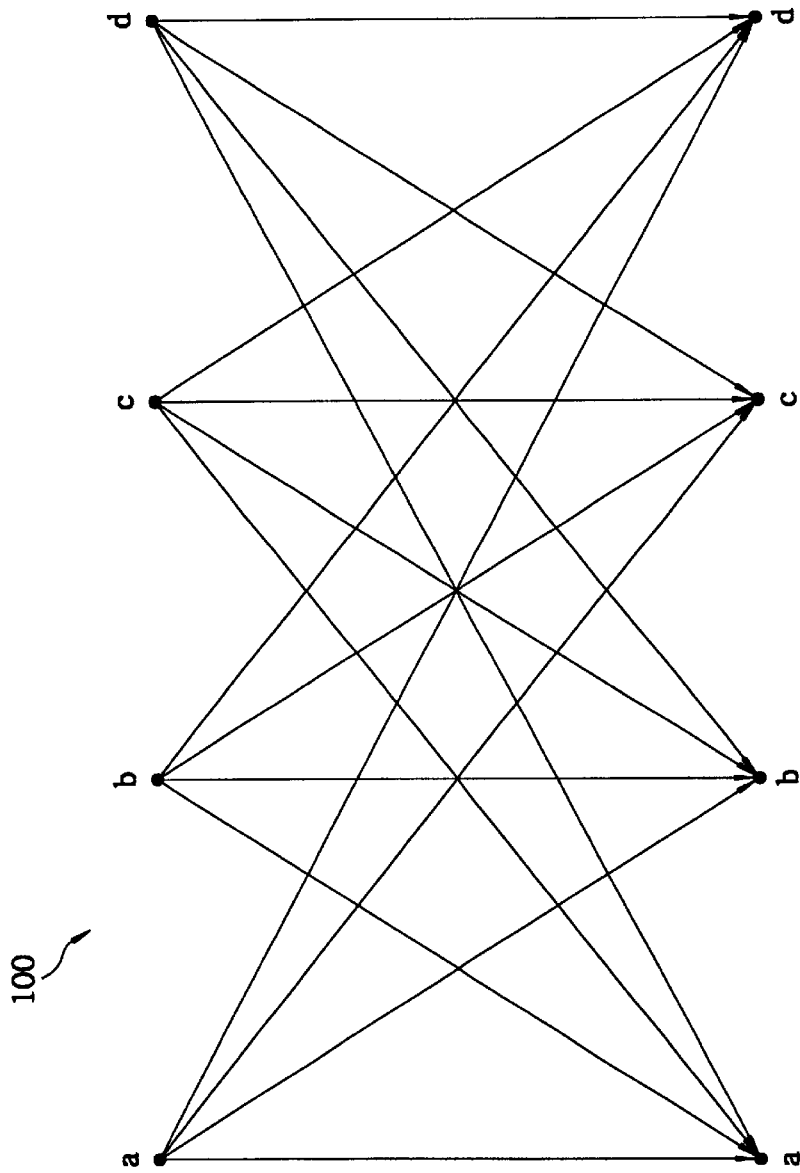
FIG. 1 represents a trellis 100 of a conventional rate 8:12 balanced finite-state code capable of correcting the error.
Figure 2:
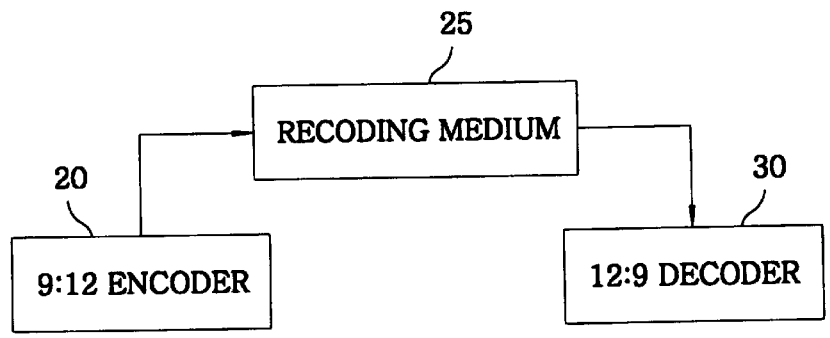
FIG. 2 illustrates a schematic block diagram of a coding/decoding system in accordance with the present invention.

Referring to FIG. 2, there is illustrated a schematic block diagram of a coding/decoding system in accordance with the present invention. The system includes a 9:12 encoder 20, a recoding medium 25 and a 12:9 decoder 30. The 9:12 encoder encodes a series of 9 bits message words into a series of 12 bits codewords. The series of the encoded codewords are stored at the recoding medium 25 and then are decoded into a series of the message words by the decoder 30. The recoding medium 25 may be a volume holographic data storage (VHDS). Details of the encoding and decoding schemes will now be described hereinafter.

Figure 3:
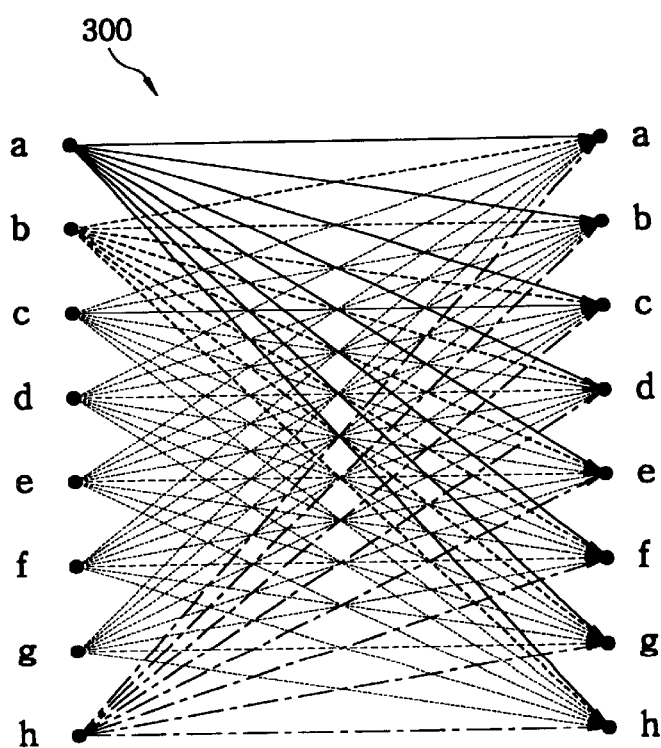
FIG. 3 depicts a trellis 300 for a finite-state code which encodes a nine-bit message word into a twelve-bit codeword in accordance with a preferred embodiment of the present invention.

Referring now to FIG. 3, there is illustrated a trellis 300 for a finite-state code which encodes a nine-bit message word into a twelve-bit codeword in accordance with the present invention. The trellis 300 has eight top level states, state a to state h. Likewise, the trellis 300 has eight bottom level states, state a to state h, which are the same states as the top level states. Predetermined three bits, e.g., the last three bits, of a nine-bit message word are used to determine a transition from a current state, i.e., a top state, to a next state, i.e., a bottom state. In a preferred embodiment of the invention, a bottom state is uniquely determined by the last three bits of a message word only. In other words, a given set of last three bits determines a unique bottom state for all top states.

Once a transition is determined by the last three bits of a message word, one of the 64 codewords in a set of codewords determined by the transition is selected by the remaining six bits, e.g., the first six bits, of the message word. The coding scheme by using the encoder trellis 300 will be described in detail hereinafter.

Each transition from one top state to one bottom state in the trellis 300 is represented by a set of 64 unbalanced codewords of 12 bits. There are sixteen such sets assigned to the transitions as shown table B. For instance, a transition from the top state c to the bottom state e is represented by a codeword set $S_3$ and that from f to h represented by a set $\underline{S}_6$.

TABLE B

| Top State | Bottom State | | | | | | | |
|---|---|---|---|---|---|---|---|---|
| | a | b | c | d | e | f | g | h |
| a | $S_1$ | $S_2$ | $S_3$ | $S_4$ | $S_5$ | $S_6$ | $S_7$ | $S_8$ |
| b | $\underline{S}_1$ | $\underline{S}_2$ | $\underline{S}_3$ | $\underline{S}_4$ | $\underline{S}_5$ | $\underline{S}_6$ | $\underline{S}_7$ | $\underline{S}_8$ |
| c | $S_2$ | $S_1$ | $S_4$ | $S_3$ | $S_6$ | $S_5$ | $S_8$ | $S_7$ |
| d | $\underline{S}_2$ | $\underline{S}_1$ | $\underline{S}_4$ | $\underline{S}_3$ | $\underline{S}_6$ | $\underline{S}_5$ | $\underline{S}_8$ | $\underline{S}_7$ |
| e | $S_3$ | $S_4$ | $S_1$ | $S_2$ | $S_7$ | $S_8$ | $S_5$ | $S_6$ |
| f | $\underline{S}_3$ | $\underline{S}_4$ | $\underline{S}_1$ | $\underline{S}_2$ | $\underline{S}_7$ | $\underline{S}_8$ | $\underline{S}_5$ | $\underline{S}_6$ |
| g | $S_4$ | $S_3$ | $S_2$ | $S_1$ | $S_8$ | $S_7$ | $S_6$ | $S_5$ |
| h | $\underline{S}_4$ | $\underline{S}_3$ | $\underline{S}_2$ | $\underline{S}_1$ | $\underline{S}_8$ | $\underline{S}_7$ | $\underline{S}_6$ | $\underline{S}_5$ |

Each set, $S_i$, where i being 1 to 8, is a set of 64 unbalanced binary codewords of 12 bits $b_0 b_1 b_2 \ldots b_{11}$, such that $b_1 + 2b_2 + 3b_3 \ldots + 11 b_{11} - i$ is a multiple of 12. The minimum distance of the codeword is 4 with the Hamming weight of 5. Also, by complementing $S_i$, i.e., converting every 1 and 0 of each codeword into 0 and 1, another eight sets of codewords, $\underline{S}_i$, can be obtained, each set having the minimum Hamming distance and the Hamming weight of 4 and 7, respectively.

FIG. 4 represents a part of exemplary codebook 400 for containing the respective codewords of the codeword sets $S_i$, and $\underline{S}_i$ in table B. The codebook 400 contains a codeword identification (ID) for each of the 64 6-bit source words, which correspond to 64 first 6-bits of the possible nine-bit message words, and its corresponding codeword in each of the codeword sets $S_1$–$S_8$ and $\underline{S}_1$–$\underline{S}_8$. The nine-bit message words are divided into 8 subsets, $U_i$, where i=1 . . . 8, by the last 3 bits of each message word. The subset $U_i$ indicates a bottom state to proceed from a top state, which in turn determines the state transition and its corresponding codeword set. The first six bits of each message word are used to index a corresponding codeword in the determined codeword set.

Figure 5:
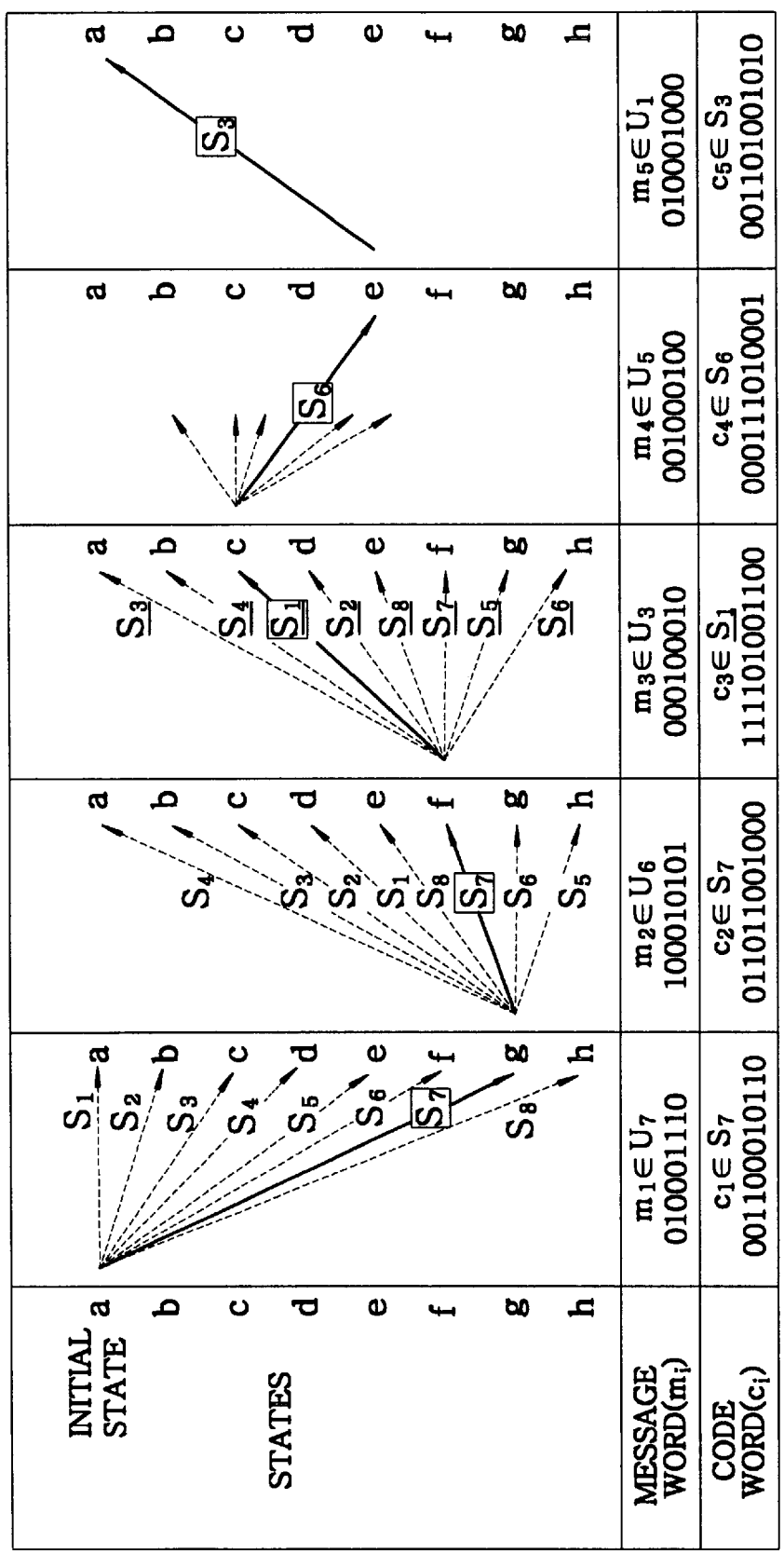
FIG. 5 provides an encoder trellis 500 for encoding nine-bit message words into twelve-bit codewords in accordance with the preferred embodiment of the present invention.

FIG. 5 shows an encoder trellis 500 for encoding nine-bit message words into twelve-bit codewords at the encoder 20 shown in FIG. 2 in accordance with the preferred embodiment of the present invention.

An initial state, i.e., the first top state, can be arbitrarily chosen, but it is assumed for simplicity that the initial state is state "a" and the message words are encoded in the order of $m_1$, $m_2$, $m_3$, $m_4$ and $m_5$, e.g., 010001110, 100010101, 000100010, 001000100 and 010001000, as shown in FIG. 5. The three LSBs of the first message word $m_1$ are 110, so that $m_1$ belongs to the 7th subset $U_7$, which corresponds to the transition to the 7th bottom state "g". The state transition from "a" to "g" corresponds to the codeword set $S_7$ as specified in Table B. The six MSBs of $m_1$ is "010001", which corresponds to the codeword ID 18, and its corresponding codeword in the codeword set $S_7$ equals "001100010110" as shown in FIG. 4. Therefore, the codeword $c_1$ is determined as "001100010110".

Likewise, the 2nd message word $m_2$ belongs to the subset $U_6$ because the last three bits thereof are 101. Therefore, the state transition of the message word $m_2$ is determined as "g" to "f". The corresponding codeword set from the top state "g" to the bottom state "f" is $S_7$ as shown in table B. Accordingly, the message word $m_2$ is encoded as a codeword $c_2$, e.g., "011011001000", $c_2$ being a codeword in the codeword set $S_7$ corresponding to the first six bits of the message word $m_2$, i.e., "100010".

The remaining message words $m_3$ to $m_5$ are encoded in an identical manner as in the case of $m_1$ and $m_2$ to provide codewords $c_3$–$c_5$ of, e.g., "111101001100", "000111010001" and "001101001010" as shown in FIG. 5. Details of the encoding procedure for $m_3$ to $m_5$ will not be repeated for the sake of simplicity.

FIG. 6 describes a part of procedure for decoding a received data word into a corresponding codeword at the decoder 30 shown in FIG. 2 in accordance with the preferred embodiment of the present invention. Once the intensity values of a data word corresponding to one codeword are received by the decoder 30, one candidate codeword is determined for each of the codeword sets $S_1$–$S_8$ and $\underline{S}_1$–$\underline{S}_8$, wherein the Euclidian distance (ED) between the received data word and the determined candidate codeword of a codeword set is not greater than EDs for the remaining codewords in that codeword set. In other words, EDs between the received data word and respective codewords of each codeword set are calculated and then a codeword yielding a minimum ED is selected as the candidate codeword for each codeword set.

FIG. 6 shows a set of candidate codewords for the received data word represented by the intensity values of [0.16 0.16 0.71 0.77 0.22 0.08 0.19 0.68 0.31 0.81 0.70 0.13]. The candidate codeword for the codeword set $S_1$ is, e.g., "000100011110". Its codeword ID and ED are 7 and 1.19, respectively. Likewise, the candidate codeword in $S_2$ is "001110010010" having the codeword ID of 19 and ED of 1.34, and so on.

Figure 7:
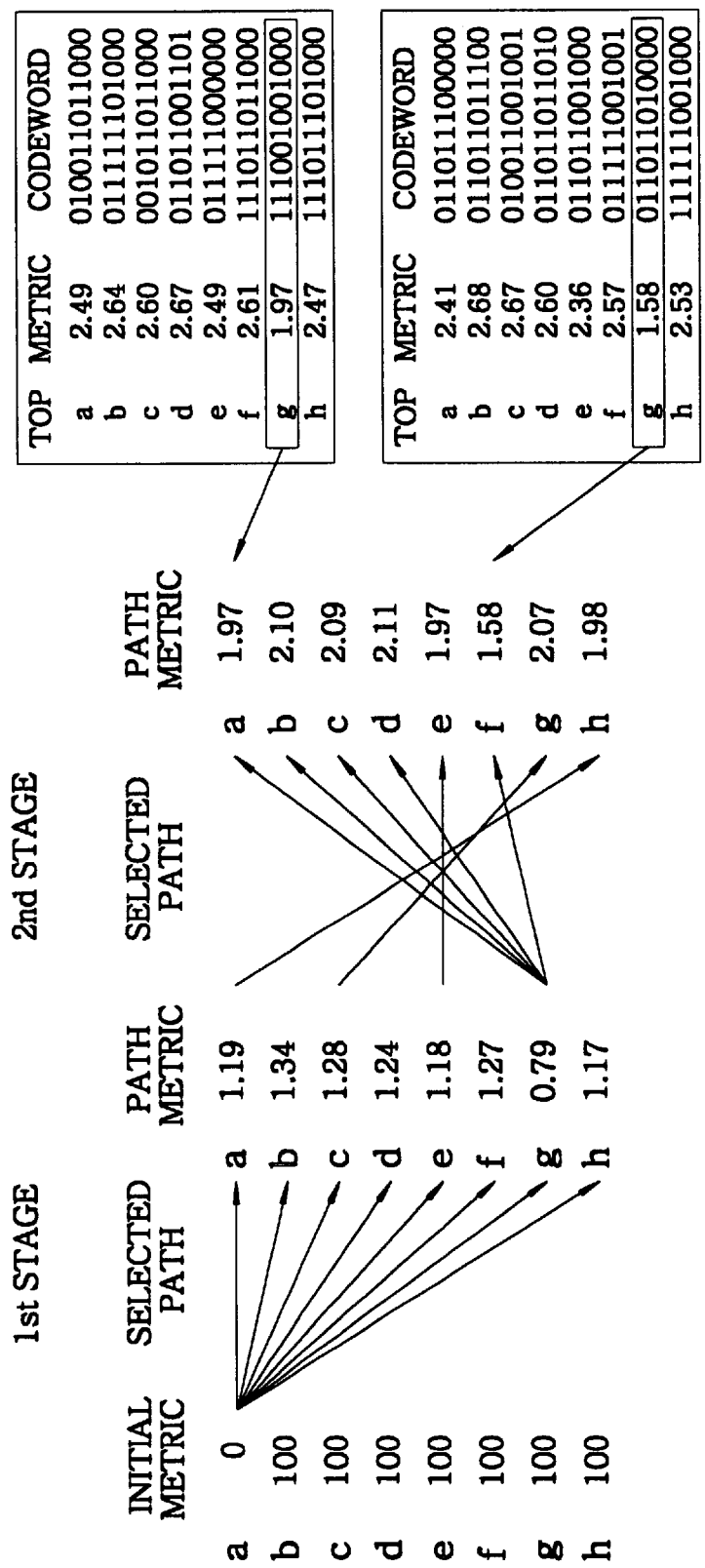
FIG. 7 presents an initial portion of a decoder trellis for decoding the received data word in accordance with the preferred embodiment of the present invention.

FIG. 7 shows an initial portion of a decoder trellis for decoding the received data words at the decoder 30. Each possible transition from one state to a next state, i.e., a transition from a top to a bottom state at each stage is called a branch. Each branch, therefore, is related to one codeword set. A branch metric is calculated for a top-to-bottom state transition associated with each branch in the trellis diagram. The branch metric for each branch is given by the ED between the received data word and the candidate codeword in the corresponding codeword set as described in FIG. 6.

Concatenated branches constitute a path and every path passing through the trellis has an associated path metric, which is the sum of the branch metrics for the branches that make up that particular path. Further, a path entering a current state may be extended to a next state to which a transition is allowed from the current state. The path metric for such an extended path is a sum of the path metric associated with the path which entered the current state and the branch metric associated with the newly included branch.

The decoding process proceeds to calculate the branch metric for each of the newly generated branches of the trellis diagram. For each bottom state in every decoding stage, there are eight candidate paths. The decoder 30 compares the path metrics of the 8 different candidate paths entering every bottom state and retains the path with the smallest path metric as the surviving path for that bottom state. All other paths entering that bottom state are discarded. The decoding scheme by using the decoder trellis will be described in further detail hereinafter.

As is well known, the initial state, i.e., the first top state can be arbitrarily chosen, but it is assumed herein for simplicity in FIG. 7 that the initial state is state "a". Therefore, the initial metric is set as 0 for a top state "a" and 100 for others. In a first stage, the allowable transitions from the top state "a" are transitions to one of the bottom states "a" through "h" and each of the branch metrics corresponding to the respective state transitions is calculated.

At the first stage, it is assumed that the decoder 30 retrieve the codeword $c_1$ (FIG. 5) from the recoding medium 25 and the received data values of $c_1$ are equal to those specified in FIG. 6. Then the branch metrics for the bottom states a–h are 1.19, 1.34, . . . , 0.79 and 1.17 as shown in FIG. 7. The branch metrics are equal to the path metrics in the first stage because the initial metric was set to "0". The branch metric 1.19 of the "a-a" state transition is given by ED between the candidate codeword, i.e., "000100011110" selected in codeword set $S_1$ and the received data word. The branch metric value 1.19, codeword ID 7 and the subset index i of the bottom state "a", i.e., the index value "1" are stored in the decoder as a set of branch data for the branch "a-a". Likewise, the branch metric 1.34 of the "a-b" state transition is given by ED between the candidate codeword in codeword set $S_2$, i.e., "001110010010" and the received data word. The branch metric value 1.34, codeword ID 19 and the subset index 2 of the bottom state are stored in the decoder. Details of the path metric calculating procedure for remaining bottom states "c" to "h" will not be repeated for the sake of simplicity.

At a 2nd stage, there are eight candidate paths for each of bottom states "a" to "h". For instance, the candidate paths are paths "a-a-a", "a-b-a", . . . , "a-g-a" and "a-h-a" for the bottom state "a". Each of the candidate paths has a path metric. For example, for the bottom state "a", a path metric 2.49 for the candidate path "a-a-a" is derived by adding a branch metric, i.e., ED between the received data word of the codeword $c_2$ and a candidate codeword, e.g., "010011011000" for the "a-a" state transition at the $2^{nd}$ stage, to the path metric 1.19 for the path "a-a". The candidate codeword "010011011000" obtained from in the manner described with reference to FIG. 6 has a minimum ED of the EDs between the received data word and 64 codewords in the codeword set $S_1$ corresponding to "a-a" state transition.

Likewise, for the path "a-b-a", the path metric 2.64 is derived by adding a branch metric, i.e., ED between the received data word of the codeword $c_2$ and a candidate codeword "011111101000" for the "b-a" state transition to the path metric 1.34 for the path "a-b". The candidate codeword "011111101000" has a minimum ED of the EDs between the received data word and 64 codewords in the codeword set $\underline{S}_1$ corresponding to "b-a" state transition.

The remaining path metrics 2.60, 2.67, 2.49, 2.61, 1.97 and 2.47 are calculated in an identical manner as in the case of metrics 2.49 and 2.64, respectively. Among the 8 candidate paths for the bottom state "a", the path "a-g-a" has the least path metric of 1.97. Therefore, the paths other than "a-g-a" are discarded and the path "a-g-a" is selected as the survivor path for the current bottom state "a". The path history for the survivor path "a-g-a" for the current bottom state "a" are stored in the decoder 30, wherein the path history includes a set of branch data for each branch of the survivor path. Each set of branch data includes branch metric, codeword ID and subset index i described above.

Survivor paths for the remaining bottom states "b" to "h" are determined in an identical manner as in the case of the bottom state "a".

Figure 8:
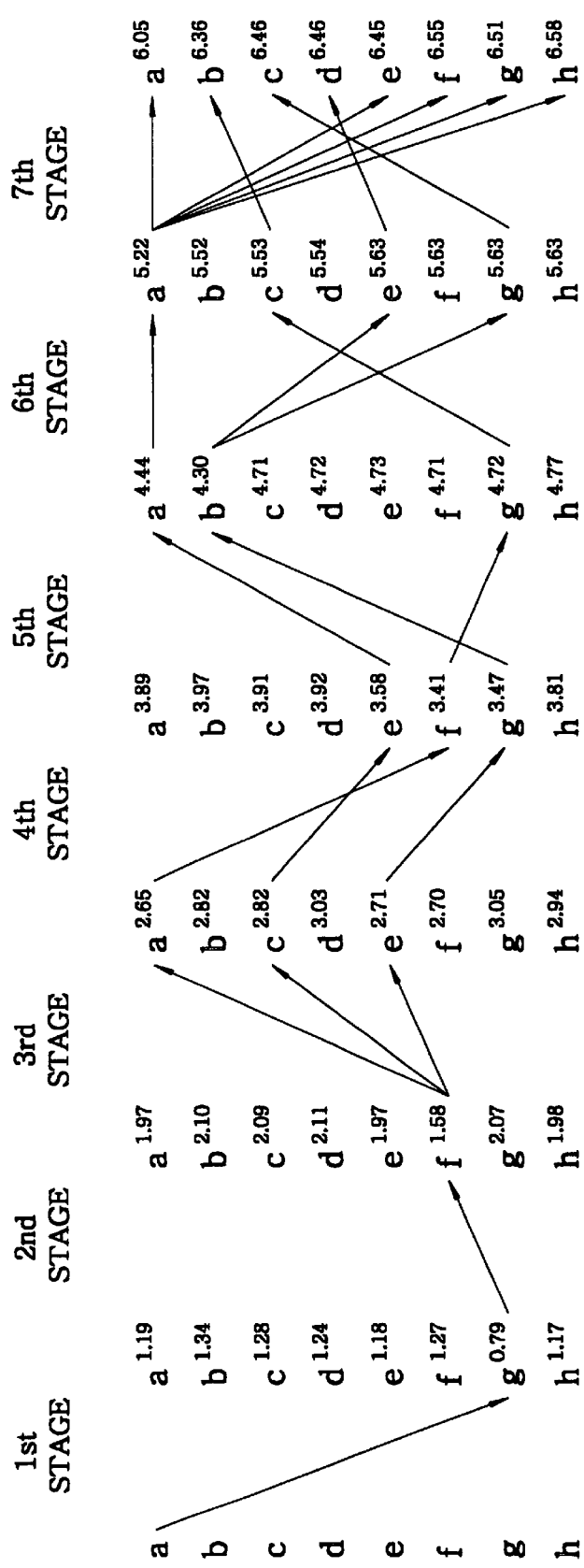
FIG. 8 represents an exemplary decoder trellis for decoding the received data words into the message words in accordance with the preferred embodiment of the present invention.

FIG. 8 represents an exemplary decoder trellis for decoding received data words into message words in accordance with the preferred embodiment of the present invention. Only one path survives for each of the bottom states "a" to "h". For example, a path corresponding to the bottom state "a" in 7th stage is "a-g-f-c-e-a-a-a" and its path metric is 6.05. Likewise, a path corresponding to the bottom state "b" is "a-g-f-a-f-g-c-b" and its path metric is 6.36, and so forth. The survivor path into each bottom state and its path metric at the 7th stage are shown exemplary in FIG. 8. As can be seen from FIG. 8, the survivor paths of the 7th stage merge with each other at the 1st and the 2nd stages. Therefore, the decoder 30 can decide that the state transitions at the 1st and the 2nd stages are "a-g" and "g-f", respectively. Details of the decoding procedure will be described below.

Ideally, decoding of the received data words, i.e., the transmitted codewords can be achieved by tracing back any survivor paths of the decoder trellis until they are merged into a single branch. The traceback depth, i.e., the number of stages to trace back, is predetermined to ensure a single merged branch after tracing back the trellis. It may be preferable, however, that the tracing is performed along the best path, the best path being a survivor path having the minimum path metric. If the traceback depth is 6, a codeword corresponding to the state transition at the 1st stage is decoded. The decoder 30 stores the sets of branch data of the latest (n+1) branches of each survivor path to maintain the traceback depth "n". The path metric for each survivor path is the sum of the metrics of the newest "n" branches for that path. The message word is reconstructed based on the codeword ID and the subset index of the oldest set of branch data. Therefore, if n=6, the message word corresponding to the 1st stage is reconstructed upon establishing the survivor paths of the 7th stage. As staged, the message word of the 1st stage can be obtained from the codeword ID and the subset index of the "a-g" state transition of the 1st stage. Since the stored codeword ID and subset index for the 1st stage are 18 and 7, the first six bits of the message word is "010001" and the last three bits thereof is "110". As a result, the decoded message word is determined as "010001110". This message word is consistent with the first message word $m_1$. Further message words are obtained in the identical manner described above as the trellis proceeds.

Figure 9:
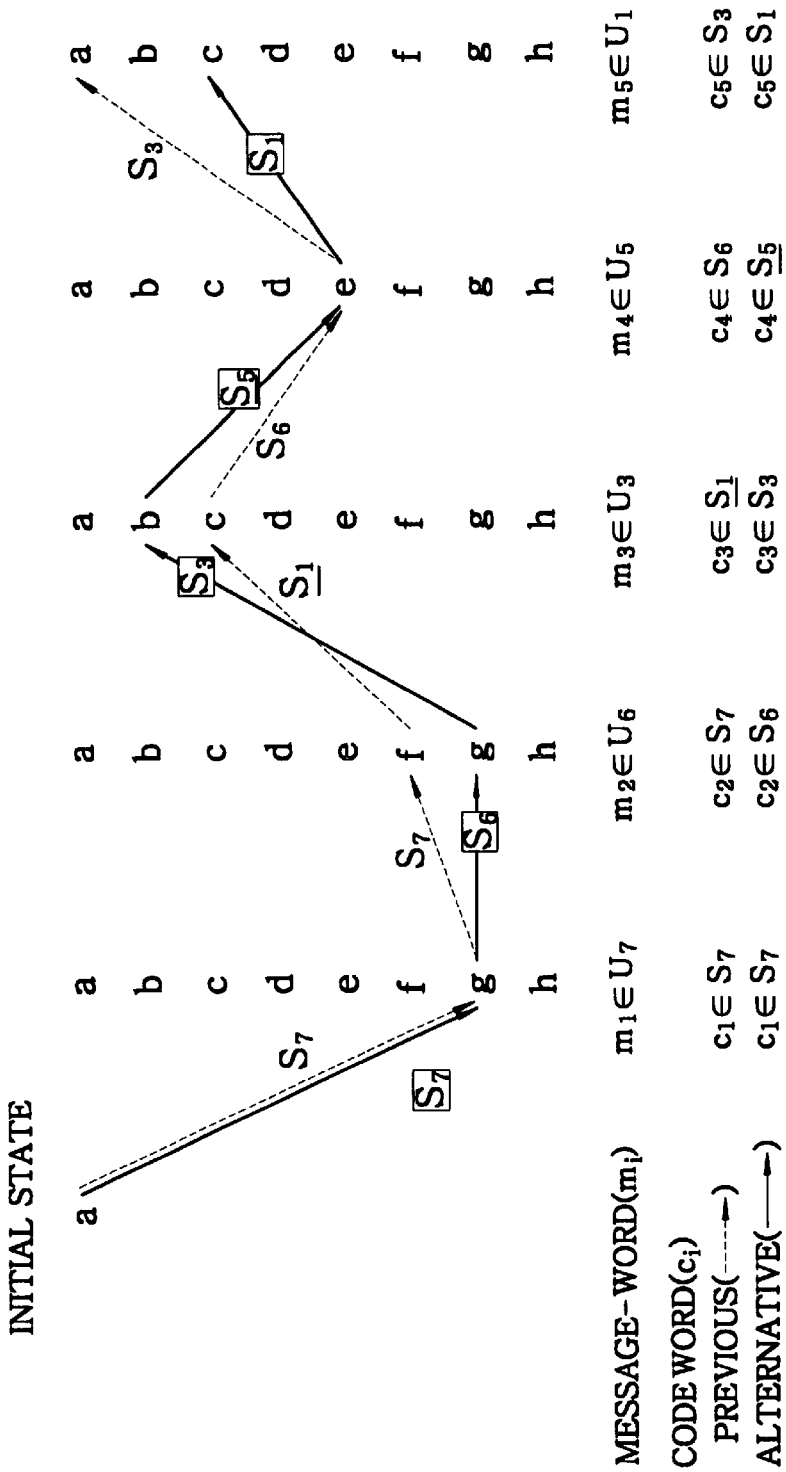
FIG. 9 shows a flow diagram for encoding nine-bit message words into twelve-bit codewords in accordance with another preferred embodiment of the present invention.

FIG. 9 shows a flow diagram for encoding nine-bit message words into twelve-bit codewords in accordance with another preferred embodiment of the present invention. In another embodiment, predetermined three bits, e.g., the last three bits, of a nine-bit message word are used to determine a corresponding codeword set. A bottom state is uniquely determined by using a current state, i.e., a top state, and the determined codeword set.

Once the codeword set and a transition from the top state to the bottom state is determined, one of the 64 codewords in a set of codewords determined by the transition is selected by the remaining six bits, e.g. the first six bits, of the message word. Another coding scheme by using the encoder trellis 300 will be described in detail hereinafter.

An initial state, i.e., the first top state, can be arbitrarily chosen, but it is assumed for simplicity that the initial state is state "a" and the message words are encoded in the order of $m_1$, $m_2$, $m_3$, $m_4$ and $m_5$, e.g., 010001110, 100010101, 000100010, 001000100 and 010001000, as shown in FIG. 5. The three LSBs of the first message word $m_1$ are 110, so that m1 belongs to the 7th subset $U_7$, which corresponds to codeword set $S_7$. Among a plurality of possible transitions from the top state "a" to one of the bottom states, the transition corresponding to the codeword set $S_7$ is the transition to the bottom state "g" as specified in Table B. The six MSBs of $m_1$ is "010001", which corresponds to the codeword ID 18, and its corresponding codeword in the codeword set $S_7$ equals "001100010110" as shown in FIG. 4. Therefore, the codeword $c_1$ is determined as "001100010110".

Likewise, the 2nd message word $m_2$ belongs to the subset U6 because the last three bits thereof are 101. Therefore, the 2nd message word $m_2$ corresponds to codeword set $S_6$. Among a plurality of possible transitions from the top state "g" to one of the bottom states, the transition corresponding to the codeword set $S_6$ is the transition to the bottom state "g" as specified in Table B. Accordingly, the message word $m_2$ is encoded as a codeword $C_2$ being a codeword in the codeword set $S_6$ corresponding to the first six bits of the message word $m_2$, i.e., "100010".

The remaining message words $m_3$ to $m_5$ are encoded in an identical manner as in the case of $m_1$ and $m_2$ to provide codewords $c_3$–$c_5$. Details of the encoding procedure for $m_3$ to m5 will not be repeated for the sake of simplicity.

While the invention has been shown and described with respect to the preferred embodiments, it will be understood by those skilled in the art that various changes and modifications may be made without departing from the spirit and scope of the invention as defined in the following claims.

What is claimed is:

1. A method for encoding a series of M-bit message words into a series of N-bit codewords having a bounded unbalance, a part of the message words being used to index bits and others source words, wherein the M and N are positive integer and the N is larger than the M, comprising steps of:

grouping the message words to a plurality of subsets using the index bits;

classifying the unbalanced codewords to a plurality of sets based on a state transition in a trellis having states and levels, each of the classified unbalanced codewords being stored at a codebook for each codeword set, respectively, the codebook having the source words, a codeword ID for each of the source words and the classified unbalanced codewords;

encoding the message words into the respective codeword in the codebook, respectively, by using the index bits of the message words and the state transition in the trellis, the codewords being selected by transition for each state at each level of the trellis based on correlations.

2. The method of claim 1, wherein the M and the N are 9 and 12, respectively.

3. The method of claim 2, wherein the unbalanced codewords have a Hamming weight of 5 or 7, wherein the Hamming weight 7 is obtained by complementing the codewords of Hamming weight 5.

4. The method of claim 3, wherein the codewords belonging to a set of codewords have a minimum Hamming distance 4.

5. The method of claim 4, wherein the number of states in the trellis are 8.

6. A recoding medium containing data encoded by the method of claim 1.

7. A method for decoding a codeword, which is encoded by the method of claim 1, from a series of data word representing intensities of an analog signal, comprising steps of:

receiving the data word;

calculating branch metrics between the data word and each codeword in the codeword set classified by the state transition in the trellis to obtain minimum branch for each bottom states;

figuring out path metric for each bottom state based on the calculated branch metrics to select a minimum path metric thereamong for each bottom state in the trellis;

selecting a best path having the smallest path metric of the calculated path metrics;

tracing back the selected best path and decoding a codeword corresponding to a state transition into a message word by using the codeword ID in the codebook.

8. The method of claim 7, wherein the data word is output from a volume holographic storage device.

9. The method of claim 8, wherein the unbalanced codewords have a Hamming weight of 5 or 7, wherein the Hamming weight 7 is obtained by complementing the codewords of Hamming weight 5.

10. The method of claim 9, wherein the codewords belonging to a set of codewords have a minimum Hamming distance 4.

11. The method of claim 10, wherein the number of states in the trellis are 8.

* * * * *